US008482285B2

(12) United States Patent
Grissom et al.

(10) Patent No.: US 8,482,285 B2
(45) Date of Patent: Jul. 9, 2013

(54) MULTIBASELINE PRF-SHIFT MAGNETIC RESONANCE THERMOMETRY

(75) Inventors: William A. Grissom, Munich (DE); Kim Butts Pauly, Stanford, CA (US); Michael Lustig, Berkeley, CA (US); Yoav Medan, Haifa (IL); Yoav Levy, Hinanit (IL); Viola Rieke, Los Altos (DE)

(73) Assignees: Insightec Ltd., Tirat Carmel (IL); The Board of Trustees of The Leland Stanford Junior University, Palo Alto, CA (US)

( * ) Notice: Subject to any disclaimer, the term of this patent is extended or adjusted under 35 U.S.C. 154(b) by 358 days.

(21) Appl. No.: 13/009,318

(22) Filed: Jan. 19, 2011

(65) Prior Publication Data

US 2011/0178386 A1    Jul. 21, 2011

Related U.S. Application Data

(60) Provisional application No. 61/296,214, filed on Jan. 19, 2010.

(51) Int. Cl.
*G01V 3/00* (2006.01)
(52) U.S. Cl.
USPC .......................................... 324/312; 324/318
(58) Field of Classification Search
USPC ............................ 324/300–322; 600/407–445
See application file for complete search history.

(56) References Cited

U.S. PATENT DOCUMENTS

| 4,554,925 | A | 11/1985 | Young |
| 4,558,279 | A | 12/1985 | Ackerman et al. |
| 5,284,144 | A | 2/1994 | Delannoy et al. |
| 5,378,987 | A | 1/1995 | Ishihara et al. |
| 5,711,300 | A | 1/1998 | Schneider et al. |
| 5,916,161 | A | 6/1999 | Ishihara et al. |
| 6,064,206 | A | 5/2000 | Van Vaals et al. |
| 6,067,371 | A | 5/2000 | Gouge et al. |
| 6,194,899 | B1 | 2/2001 | Ishihara et al. |
| 6,242,915 | B1 | 6/2001 | Hurd |
| 6,377,834 | B1 | 4/2002 | Zhou et al. |
| 6,397,094 | B1 | 5/2002 | Ludeke et al. |
| 6,522,142 | B1 | 2/2003 | Freundlich |
| 6,542,767 | B1 | 4/2003 | McNichols et al. |
| 6,559,644 | B2 | 5/2003 | Froundlich et al. |
| 6,566,878 | B1 | 5/2003 | Komura et al. |

(Continued)

FOREIGN PATENT DOCUMENTS

| EP | 0560397 | 9/1993 |
| EP | 1582886 | 10/2005 |
| WO | WO-2008119054 | 10/2008 |
| WO | WO-2009055587 | 4/2009 |

OTHER PUBLICATIONS

Bouchard et al., "Magnetic Resonance Imaging of Thermal Coagulation Effects in a Phantom for Calibrating Thermal Therapy Devices," Medical Physics, vol. 27, No. 5, pp. 1141-1145 (May 1, 2000).

(Continued)

*Primary Examiner* — Brij Shrivastav
(74) *Attorney, Agent, or Firm* — Bingham McCutchen LLP

(57) ABSTRACT

The phase background of a proton resonance frequency shift treatment image may be estimated by fitting a combination of baseline images to the treatment image.

18 Claims, 7 Drawing Sheets

U.S. PATENT DOCUMENTS

| | | | |
|---|---|---|---|
| 7,062,415 | B2 | 6/2006 | Whitefield et al. |
| 7,412,835 | B2 * | 8/2008 | Legall et al. .................. 62/6 |
| 7,505,808 | B2 | 3/2009 | Anderson et al. |
| 7,511,501 | B2 | 3/2009 | Wexler |
| 2007/0055140 | A1 | 3/2007 | Kuroda |
| 2007/0239062 | A1 | 10/2007 | Chopra et al. |
| 2009/0096450 | A1 | 4/2009 | Roland |
| 2011/0046472 | A1 | 2/2011 | Schmidt et al. |
| 2011/0046475 | A1 | 2/2011 | Assif et al. |

OTHER PUBLICATIONS

Wlodarczyk et al, "Corrections and Calibration of MR Thermography for Hyperthermia Monitoring in the Hyperthermia/MR Hybrid System," Proceedings of the Intl. Soc. for Magnetic Resonance in Medicine, 12th Scientific Meeting and Exhibition, p. 977 (May 1, 2004).

Wang et al., "Sensitivity Study of MR-Based Temperature Mapping at 7T," Proceedings of the Intl. Society for Magnetic Resonance in Medicine, Joint Annual Meeting ISMRM-ESMRMB, p. 3377 (May 5, 2007).

McDannold et al., "Usefulness of MR Imaging-Derived Thermometry and Dosimetry in Determining the Threshold for Tissue Damage Induced by Thermal Surgery in Rabbits," Radiology, vol. 216 pp. 517-523 (2000).

Suprijanto et al., "Displacement Correction Scheme for MR-Guided Interstitial Laser Therapy," Ellis RE, Peters TM (Eds.): "MiCCAI 2003, LNCS 2879," pp. 399-407 (2003).

Shmatukha et al., "Correction of Proton Resonance Frequency Shift Proton Resonance Frequency Shift Temperature Maps for Magnetic Field Disturbances Caused by Breathing; Correction of Proton Resonance Frequency Shift Temperature Maps," Physics in Medicine and Biology, vol. 51, No. 18 pp. 4689-4705 (Sep. 21, 2006).

De Senneville et al., "An Optimised Multi-Baseline Approach for On-Line MR-Temperature Monitoring on Commodity Graphics Hardware," Biomedical Imaging, pp. 1513-1516 (May 14, 2008).

De Senneville et al., "Real-Time Adaptive methods for Treatment of Mobile Organs by MRI-Controlled High-Intensity Focused Ultrasound," Magnetic Resonance in Medicine, vol. 57, pp. 319-330 (2007).

DeZwart et al., "On-Line Correction and Visualization of Motion During MRI-Controlled Hyperthermia," Magnetic Resonance in Medicine, vol. 45, No. 1, pp. 128-137 (Jan. 1, 2001).

Beerlage et al., "Current Status of Minimally Invasive Treatment Options for Localized Prostate Carcinoma," European Urology, vol. 47, No. 1 pp. 2-13 (Jan. 2000).

Boyd et al., "Convex Optimization," Cambridge University Press, UK (2004).

Candes et al., "Enhancing Sparsity by Reweighted $\ell 1$ Minimization," Technical Report, Caltech, Pasadena, CA (2007).

Chartrand et al., "Iteratively Reweighted Algorithms for Compressive Sensing," IEEE ICASSP, pp. 3869-3872 (Apr. 2008).

Funai et al., "Regularized Field Map Estimation in MRI," IEEE Trans.Med. Imaging, vol. 27, No. 10, pp. 1484-1494 (Oct. 2008).

Grissom et al., "Hybrid Referenceless and Multibaseline Subtraction MR Thermometry for Monitoring Thermal Therapies in Moving Organs," Medical Physics, vol. 37, No. 9. pp. 5014-5026 (Sep. 2010).

Grissom et al. "Reference-less MR Thermometry Using Iteratively-Reweighted $\ell 1$ Regression," Proc. Intl. Soc. Mag. Reson. Med., vol. 17, p. 444 (2009).

Grissom et al., "Regularized Multicoil MR Thermometry," Proc. Intl. Soc. Mag. Reson. Med., vol. 17, p. 2516 (2009).

Grissom et al., "Regularized Referenceless Temperature Estimation in PRF-Shift MR Thermometry," IEEE, pp. 1235-1238 (2009).

Holbrook et al., "Real-Time MR Thermometry for Monitoring HIFU Ablations of the Liver," Magnetic Resonance in Medicine, vol. 63, pp. 365-373 (2010).

Ishihara et al., "A Precise and Fast Temperature Mapping Using Water Proton Chemicl Shift," MRM, vol. 34, pp. 814-823 (1995).

Kohler et al., "Volumetric HFU Ablation guided by multiplane MRI thermometry," 8th Intl. Symp. On Therapeutic Ultrasound, edited by E.S. Ebbini, U. of Minn. (Sep. 2009).

Kokuryo et al., "Method for Target Tracking in Focused Ultrasound Surgery of Liver Using Magnetic Resonance Filtered Venography," IEEE EMBS, pp. 2614-2617 (2007).

Kowalski et al., "Optimization of Electromagnetic Phased-Arrays for Hyperthermia via Magnetic Resonance Temperature Estimation," IEEE Trans. On Biomed. Eng., vol. 49, No. 11, pp. 1229-1241 (Nov. 2002).

Kuroda et al., "Optimization of Self-Reference Thermometry Using Complex Field Estimation," Magnetic Resonance in Medicine, vol. 56, pp. 835-843 (2006).

Larson et al., "Histological Changes of Minimally Invasive Procedures for the Treatment of Benign Prostatic Hyperplasia and Prostate Cancer: Clinical Implications," The Journal of Urology, vol. 170, pp. 12-19 (Jul. 2003).

Mougenot et al., "MR monitoring of the near-field HIFU heating," 8th Intl. Symp. On Therapeutic Ultrasound, edited by E.S. Ebbini, U. of Minn. (Sep. 2009).

Nayak et al., "Real-Time Cardiac MRI at 3 Tesla," Magnetic Resonance in Medicine, vol. 51, pp. 655-660 (2004).

Rieke et al., "Referenceless PRF Shift Thermometry," Magnetic Resonance in Medicine, vol. 51, pp. 1223-1231 (2004).

Roujol et al., "Advanced in Real-Time MR Temperature Mapping of the Human Heart," Proc. Intl. Soc. Mag. Reson. Med. vol. 17, p. 443 (2009).

Shinohara "Thermal Ablation of Prostate Diseases: Advantages and Limitations," Int. Journal of Hyperthermia, vol. 20, No. 7, pp. 679-697 (Nov. 2004).

Soher et al., "Correcting for BO Field Drift in MR Temperature Mapping with Oil References," Proceedings of the Intl. Society for Magnetic Resonance in Medicine (May 2008).

Vigen et al., "Triggered, Navigated, Multi-Baseline Method for Proton Resonance Frequency Temperature Mapping with Respiratory Motion," Magnetic Resonance in Medicine, vol. 50, pp. 1003-1010 (2003).

Wissler, "Pennes' 1948 Paper Revisited," Journal of Applied Physiology, vol. 85, pp. 35-41 (1998).

Romero-Méndez et al., "Analytical Solution of the Pennes Equation for Burn-Depth Determination From Infrared Thermographs," Mathematical Medicine and Biology, vol. 27, pp. 21-38 (Jul. 2009).

Dragonu et al., "Perfusion Calculation Based on MR-Temperature Maps and Focused Ultrasound Heating. Theoretical and Experimental Study," Intl. Society for Magnetic Resonance in Medicine, vol. 16, p. 1223 (May 3, 2008).

Chopra et al., "Method for MRI-Guided Conformal Thermal Therapy of Prostate with Planar Transurethral Ultrasound Heating Applicators; Method for Conformal Prostate Thermal Therapy," Physics in Medicine and Biology, vol. 50, No. 21, pp. 4957-4975 (Nov. 7, 2005).

Salomir et al., "Hyperthermia by MR-Guided Focused Ultrasound: Accurate Temperature Control Based on Fast MRI and a Physical Model of Local Energy Deposition and Heat Conduction," Magnetic Resonance in Medicine, vol. 43, No. 3, pp. 342-347 (Mar. 1, 2000).

Rieke et al., "Referenceless MR Thermometry for Monitoring Thermal Ablation in the Prostate," IEEE Transactions on Medical Imaging, pp. 813-821 (Jun. 1, 2007).

Suprijanto et al., "Inter-frame Motion Correction for MR Thermometry," Medical Image Computing and Computer-Assisted Intervention—MIC CAI 2005 Lecture Notes in Computer Science, pp. 580-588 (Jan. 2005).

De Senneville et al., "Motion Correction in MR Thermometry of Abdominal Organs: A Comparison of the Referenceless vs. The Multibaseline Approach," Magnetic Resonance in Medicine, vol. 64, pp. 1373-1381 (Jul. 2010).

Li et al., "An Internal Reference Model-Based PRF Temperature Mapping Method with Cramer-Rao Lower Bound Noise Performance Analysis," Magnetic Resonance in Medicine, vol. 62, pp. 1251-1260 (Sep. 2009).

International Search Report and Written Opinion mailed Aug. 16, 2011 for International Application No. PCT/US2011/021657 (22 pages).

* cited by examiner

US 8,482,285 B2

MULTIBASELINE PRF-SHIFT MAGNETIC RESONANCE THERMOMETRY

CROSS-REFERENCE TO RELATED APPLICATION

This application claims priority to and the benefit of U.S. Provisional Patent Application No. 61/296,214, filed on Jan. 19, 2010, the entire disclosure of which is hereby incorporated herein by reference.

STATEMENT REGARDING FEDERALLY SPONSORED RESEARCH

This invention was made with government support under contracts CA121163 and EB007715 awarded by the National Institutes of Health. The government has certain rights in this invention.

FIELD OF THE INVENTION

The present invention relates generally to magnetic resonance (MR) thermometry during thermal treatment of internal body tissues, and in particular to phase background compensation in proton resonance frequency (PRF) shift thermometry.

BACKGROUND OF THE INVENTION

MR imaging of internal body tissues may be used for numerous medical procedures, including diagnosis and surgery. In general terms, MR imaging starts by placing a subject in a relatively uniform, static magnetic field. The static magnetic field causes hydrogen nuclei spins to align with and cause a net magnetization in the general direction of the magnetic field. Radio frequency (RF) magnetic field pulses are then superimposed on the static magnetic field to flip some of the aligned spins, causing a net magnetization in a plane transverse to the static magnetic field that precesses about the field and thereby induces an RF response signal, called the MR echo or MR response signal. It is known that different tissues in the subject produce different MR response signals, and this property can be used to create contrast in an MR image. One or more RF receivers detect the duration, strength, frequency, and/or phase of the MR response signals, and such data are then processed to generate tomographic or three-dimensional images.

MR imaging can further provide a non-invasive means of quantitatively monitoring in vivo temperatures. This is particularly useful in MR-guided thermal therapy (e.g., MR-guided focused ultrasound (MRgFUS) treatment), where the temperature of a treatment area (e.g., a tumor to be destroyed by heat) should be continuously monitored in order to assess the progress of treatment and correct for local differences in heat conduction and energy absorption to avoid damage to tissues surrounding the treatment area. The monitoring (e.g., measurement and/or mapping) of temperature with MR imaging is generally referred to as MR thermometry or MR thermal imaging.

Among various methods available for MR thermometry, the proton resonance frequency (PRF) shift method is often the method of choice due to its excellent linearity with respect to temperature change, near-independence from tissue type, and temperature map acquisition with high spatial and temporal resolution. The PRF shift method is based on the phenomenon that the MR resonance frequency of protons in water molecules changes linearly with temperature (with a constant of proportionality that, advantageously, is relatively constant between tissue types). Since the frequency change with temperature is small, only $-0.01$ ppm/° C. for bulk water and approximately $-0.0096$ to $-0.013$ ppm/° C. in tissue, the PRF shift is typically detected with a phase-sensitive imaging method in which the imaging is performed twice: first to acquire a baseline PRF phase image prior to a temperature change and then to acquire a second phase image after the temperature change (hereinafter "treatment image"), thereby capturing a small phase change that is proportional to the change in temperature. A map of temperature changes may then be computed from the MR images by (i) determining, on a pixel-by-pixel basis, phase differences between the baseline image and the treatment image, and (ii) converting the phase differences into temperature differences based on the PRF temperature dependence while taking into account imaging parameters such as the strength of the static magnetic field and echo time (TE) (e.g., of a gradient-recalled echo).

The baseline phase can most easily be taken from the first image in a time series. This technique is, however, very sensitive to motion between the baseline images and images acquired during heating because motion causes misregistration between the images, resulting in erroneous baseline phase subtraction and inaccurate temperature estimates. If the treated organ's motion is cyclic, then an alternative to conventional baseline subtraction is acquisition and storage of multiple baseline images prior to therapy. During therapy, a well-registered baseline image can then be selected from the stored image library according to an image-similarity criterion, or based on additional information about the respective stages in the cycle of motion. Methods based on this concept are known as "multibaseline thermometry." While more tolerant of motion than conventional baseline thermometry, this technique remains very sensitive to main-field shifts during therapy, which may result, for example, from respiration or bowel filling.

Another class of methods, collectively known as "referenceless thermometry," is immune to both motion and main-field shifts. Referenceless thermometry utilizes no baseline images, instead deriving a reference phase image from the phase of the image portion corresponding to tissue surrounding a heated region. Operating under the assumption that the image phase directly surrounding a hot spot would otherwise extend smoothly into the region occupied by the hot spot, referenceless thermometry methods typically fit a set of smooth, low-order polynomial functions to the surrounding phase, or to a unit-magnitude complex image with the same phase. The polynomial is then extrapolated to locations within the hot spot, and the result used as a reference for subtraction. While referenceless methods are immune to motion, they are sensitive to rapid anatomical phase variations, since these cannot be accurately expressed as a weighted sum of smooth functions. Such variations commonly exist at organ edges. Furthermore, current referenceless methods require that the user know the location of the hot spot a priori, so that it can be masked out of the polynomial fit to avoid bias and temperature underestimation.

In light of the drawbacks of both multibaseline and referenceless PRF shift thermometry, alternative PRF methods that can compensate for motion and main-field shifts while being insensitive to anatomical boundaries are desirable.

SUMMARY

To address the respective disadvantages of multibaseline and referenceless methods, various embodiments of the present invention utilize a hybrid approach to PRF-shift thermometry, essentially combining both techniques in an optimized fashion. In some embodiments, the phase background of a treatment image, i.e., the component of the phase not attributable to the temperature change, is modeled by a combination of baseline images acquired prior to treatment, and a linear combination of smooth basis functions (e.g., polynomials) that are fitted to a region of the treatment image surrounding the hot spot and extrapolated into the hot-spot subregion. Various numerical methods may be employed to fit this hybrid image model to the treatment image in order to yield temperature change maps.

Compared to pure multibaseline methods, the hybrid approach is not undermined by main-field shifts during therapy. Compared to referenceless methods, it accommodates rapidly-varying anatomical phase, and does not require the user to have a priori knowledge of a hot spot's location in order to obtain an accurate temperature map, nor does it require sophisticated tracking techniques to follow the hot spot's location during motion. Various embodiments of the present invention are therefore more accurate and less vulnerable to common error sources than conventional thermometry techniques. Further, in certain embodiments, fewer baseline images, compared to conventional multibaseline thermometry, are required to accurately estimate temperature, resulting in higher efficiency and decreased computation time requirements.

Accordingly, in a first aspect, the invention is directed to a method of performing PRF shift thermometry. In various embodiments, the method includes acquiring one or more PRF baseline images of an imaging region (wherein each baseline image corresponds to a PRF phase background during the imaging region's cycle of motion), acquiring a PRF treatment image of the imaging region subsequent to a temperature change of a subregion within the imaging region, and estimating a phase background of the imaging region. The phase background may be estimated based on (i) the baseline image(s) and (ii) a smooth extension of a phase surrounding the subregion into the subregion. The temperature distribution, in turn, may be estimated within the subregion based on the treatment image and the estimated phase background. The method may also include identifying the subregion to be heated, via a computer algorithm and/or user input.

The baseline and treatment images may be two-dimensional or three-dimensional images. Typically, they are acquired in the same patient; in certain embodiments, however, baseline images are acquired in one or more patients prior to treatment of (and acquisition of a treatment image in) a different patient. The phase background may be based on a single baseline image selected among a plurality of baseline images, or on a weighted average or a non-linear combination of multiple baseline images. The baseline and treatment images may comprise k-space raw data and, in particular, multiple k-space segments (where k-space segments in baseline images have corresponding k-space segments in the treatment image); the coefficient(s) associated with the baseline image(s) may then be determined for each k-space segment independently. (The term "k space" refers to the two-dimensional or three-dimensional Fourier transform of the MR image. Its complex values are sampled during an MR measurement. In practice, k-space raw data means temporary image data obtained from digitized MR signals during acquisition. When k space is full, at the end of the scan, the data are mathematically processed to produce a final "real-space" image.)

In some embodiments, the baseline image(s) are registered to the treatment image and transformed into corresponding adjusted baseline images based on the registration, and the phase background is subsequently estimated based on the adjusted baseline image(s). The transformation may compensate for relative in-plane or out-of-plane motion of the imaging region between the baseline image(s) and the treatment image.

In some embodiments, the phase background is estimated by deriving a baseline phase from the baseline image(s) and subtracting the baseline phase from the treatment image so as to generate a residual phase, and then smoothly extending the residual phase surrounding the subregion into the subregion. In the case of multiple baseline images, deriving the baseline phase may involve determining coefficients associated with a combination of the baseline images. The coefficients may be based on the similarity of the baseline images to the treatment image, on the proximity of the stages of the baseline images to the stage of the treatment image within the respiratory and/or cardiac cycle, or on the proximity of the location of the subregion within the baseline images to the location of the subregion within the treatment image.

The residual phase may be smoothly extended into the subregion by regression (e.g., least-square regression) after removal of pixels corresponding to the subregion from an image of the residual phase. Alternatively, in some embodiments, the residual phase is smoothly extended into the subregion by a regression method that does not require removal of pixels corresponding to the subregion from an image of the residual phase, e.g., an iterative reweighted L1 regression. Further, in some embodiments, smoothly extending the residual phase into the subregion includes computing finite differences between neighboring pixels in an image of the residual phase to determine a residual phase derivative, smoothly extending the residual phase derivative into the subregion, and then integrating the smoothly extended residual phase derivative to obtain the smoothly extended residual phase.

In some embodiments, the phase background and the temperature distribution are estimated by minimizing a penalized likelihood cost function with respect to (one or more) coefficients associated with the baseline image(s), coefficients associated with the smooth extension, and temperature-induced phase shifts within the subregion. The penalized likelihood cost function may include a non-sparseness penalty and/or a roughness penalty for the temperature-induced phase shifts. In certain embodiments, the cost function has the form:

$$\Psi(\vec{w}, \vec{c}, \vec{t}) = \frac{1}{2}\sum_{j=1}^{N_s}\left|y_j - \left(\sum_{b=1}^{N_b} x_{b,j}w_b\right)e^{i\left(\{A\vec{c}\}_j + t_j\right)}\right|^2 + \lambda\|\vec{t}\|_0 + \beta R(\vec{t}),$$

wherein $y_j$ denote the components (corresponding to the pixels) of the treatment image, $x_{b,j}$ denote the components of at least one baseline image, $w_b$ denotes the at least one coefficient associated with the at least one baseline image, A denotes a matrix of basis functions associated with the smooth extension, $\vec{c}$ denotes a vector of the coefficients associated with the smooth extension, $t_j$ denote the components of the temperature-induced phase shift, $\|\vec{t}\|_0$ denotes the number of elements in $\vec{t}$, $N_S$ is the number of pixels in the treatment image, $N_b$ is the number of acquired baseline images, R denotes a roughness penalty function, and $\lambda$ and $\beta$ are regularization parameters.

The phase background may, alternatively, be estimated by fitting a linear combination of the baseline image(s) and smooth pixilated basis functions (e.g., polynomials) to the treatment image using, for example, iterative least-square regression.

The baseline and treatment images are in some embodiments acquired with multiple MRI receiver coils. The images may then be combined across the MRI receiver coils prior to estimating the phase background. Alternatively, the phase background may be estimated independently for each MRI receiver coil, and the temperature distribution may be synthesized based on weighted combinations, across receiver coils, of the treatment images and estimated phase backgrounds. In yet another embodiment, the phase background is estimated for each MRI receiver coil, but parameters associated with the estimations are shared across the receiver coils. The temperature distribution may also be estimated using a penalized-likelihood algorithm applied jointly to the (baseline and treatment) images acquired multiple MRI receiver coils.

In another aspect, the invention provides a system for performing PRF shift thermometry. The system includes an MRI unit, a control module in communication with the MRI unit, and a display for showing the temperature distribution. The control module is configured to cause the MRI unit to acquire one or more PRF baseline images of an imaging region and, subsequent to a temperature change in a subregion, a treatment image; to estimate a phase background of the imaging region based (at least in part) on the baseline image(s) and a smooth extension of a phase surrounding the subregion into the subregion; and to estimate a temperature distribution within the subregion based on the treatment image and the estimated phase background. In various embodiments, the system (and, in particular, the control module) may implement the features of the PRF shift thermometry method described above.

In yet another aspect, a multibaseline method of performing PRF thermometry includes acquiring a plurality of (two- or three-dimensional) PRF baseline images of an imaging region (each baseline image corresponding to a PRF phase background during the imaging region's cycle of motion) and, subsequent to a temperature change of a subregion, a correspondingly two- or three-dimensional PRF treatment image of the imaging region. Further, it includes estimating a phase background of the imaging region by fitting a combination of the PRF baseline images to the treatment image, and estimating a temperature distribution within the subregion based on the treatment image and the estimated phase background.

The combination of the baseline images may include a weighted average of the baseline image, which may be fitted to the treatment image by determining weights associated with the weighted average. In some embodiments, the combination of the baseline images is nonlinear (or includes a nonlinear combination); such a nonlinear combination may, for example, compensate for a shift in one of the baseline images. Further, in some embodiments, the phase background is estimated by fitting a combination of a subset of the baseline images, selected based on navigator information, to the treatment image. Conversely, one or more baseline images may be shifted, and the resulting shifted baseline images be added to the plurality of baseline images used in the phase background estimation. In certain embodiments, the phase background is modified by a smooth extension of the phase surrounding the subregion into the subregion, prior to estimating the temperature distribution.

The treatment image and the baseline images may include real-space or k-space raw image data. In the latter case, the combination of baseline images may be fitted to the treatment image independently for each of multiple k-space segments.

Further, the baseline and treatment images may be acquired with multiple MRI receiver coils, and may be combined across receiver coils prior to the phase background estimation. Alternatively, the phase background may be estimated independently for each MRI receiver coil (or separately, but with shared estimation parameters across coils), or jointly for some or all of the receiver coils (e.g., by using a joint penalized-likelihood algorithm). In general, any feature described with respect to the hybrid method that is not contingent upon the referenceless component may be implemented in a pure multibaseline method as well.

A further aspect of the invention relates to a system for performing multibaseline PRF shift thermometry (e.g., in accordance with the above-described multibaseline technique). In various embodiments, the system includes an MRI unit and, in communication with the MRI unit, a control module configured to cause the MRI unit to acquire a plurality of PRF baseline images of an imaging region (where each baseline image corresponds to a PRF phase background during the cycle of motion) as well as a treatment image of the imaging region (subsequent to temperature change of a subregion within the imaging region); to estimate a phase background of the imaging region by fitting a combination of the PRF baseline images to the treatment image; and to estimate the temperature distribution within the subregion based on the treatment image and the estimated phase background. The system may further include a display for displaying the temperature distribution.

BRIEF DESCRIPTION OF THE DRAWINGS

The foregoing will be more readily understood from the following detailed description in conjunction with the drawings, in which.

DETAILED DESCRIPTION

1. MRI System and PRF Thermometry

Figure 1:
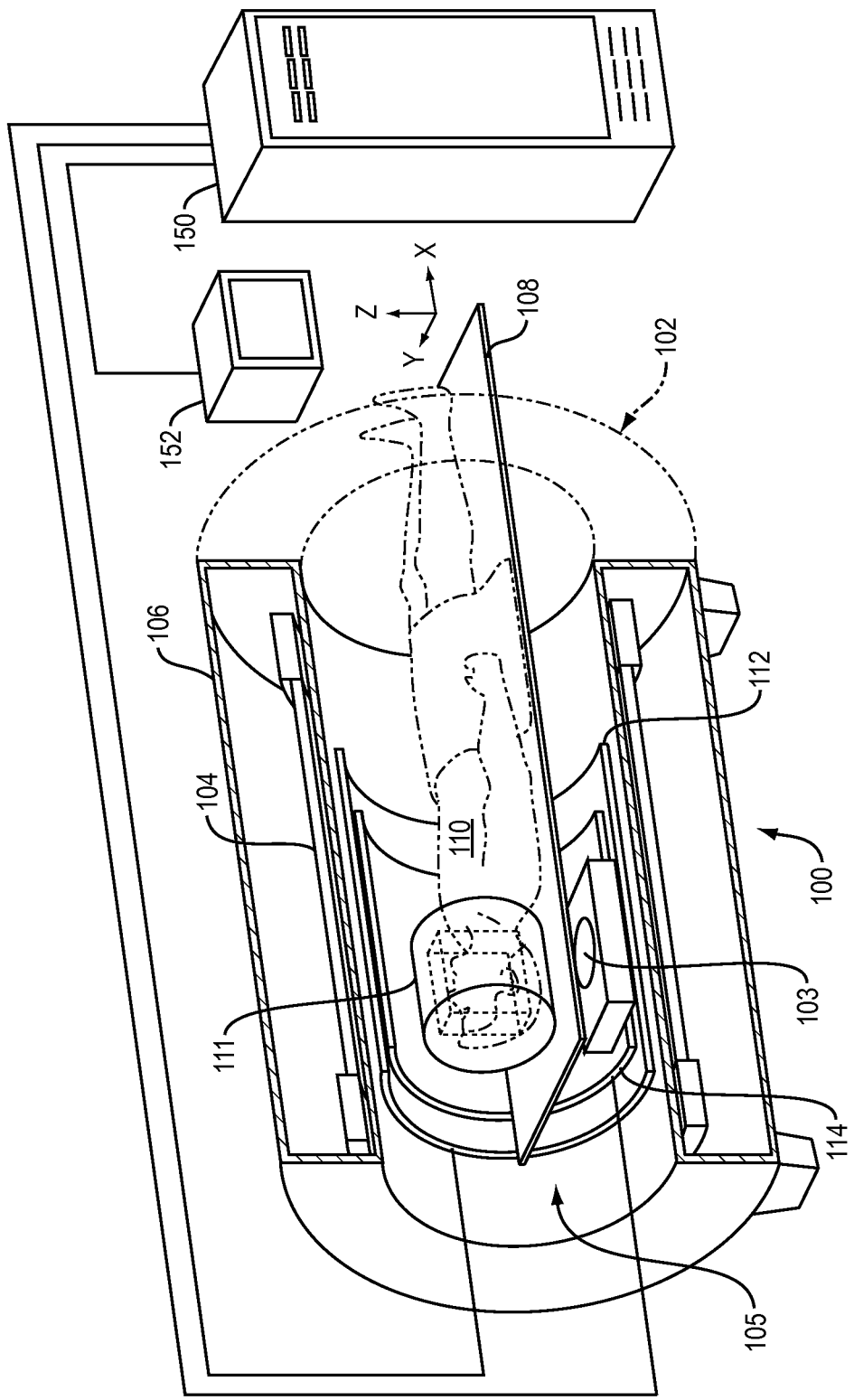
FIG. 1 shows an exemplary MRI system in which PRF-MR thermometry in accordance with the present invention may be implemented.

MRI systems in which the techniques described herein may be implemented are well-known in the art; an exemplary system is shown in FIG. 1. The illustrated system 100 comprises an MRI machine 102 and, when an MR-guided thermal procedure is being performed, a thermal therapy device 103 that may be disposed within the bore of the MRI machine 102. The thermal therapy device 103 may be, for example, an ultrasound transducer, an RF or microwave ablation device, a laser, or any other device adapted to heat a target tissue, and may be configured either for placement outside the patient or for insertion into the patient's body. The MRI machine 102 typically comprises a cylindrical electromagnet 104, which generates a static magnetic field within a bore 105 of the electromagnet 104. The electromagnet 104 may be enclosed in a magnet housing 106. A support table 108, upon which a patient 110 lies during treatment, is disposed within the magnet bore 105. The patient 110 is positioned such that the target tissue, which constitutes the region of interest (ROI), is located within an imaging region 111 in which the static magnetic field is substantially homogeneous.

The MRI machine 102 further includes a set of cylindrical magnetic field gradient coils 112, which are typically located within the magnet bore 105, surrounding the patient 110. The gradient coils 112 can generate magnetic field gradients of predetermined magnitudes at predetermined times. Usually, at least three gradient coils 112 that generate magnetic field gradients in three mutually orthogonal directions are provided. Using the field gradients, different spatial locations can be associated with different precession frequencies, thereby giving an MR image its spatial resolution. Further, an RF transmitter coil 114 surrounds the imaging region 111. The RF transmitter coil 114 emits an RF excitation pulse into the imaging region 116, thereby changing the net magnetization of the imaged tissue. The RF transmitter coil 114 may also be used to receive MR response signals emitted from the imaging region 111. Alternatively, the MRI machine 102 may include one or more dedicated RF receiver coils. The MR response signals are amplified, conditioned, digitized into raw data, and converted into arrays of image data using an image-processing system 150, as is known by those of ordinary skill in the art. The image data may then be displayed on a monitor 152, such as a computer CRT, LCD display or other suitable display.

In typical MR imaging procedures, the emission of the RF excitation pulse, the application of the field gradients in various directions, and the acquisition of the RF response signal take place in a predetermined sequence. For example, in some imaging sequences, a linear field gradient parallel to the static magnetic field is applied simultaneously with the excitation pulse to select a slice within the three-dimensional tissue for imaging. Subsequently, time-dependent gradients parallel to the imaging plane may be used to impart a position-dependent phase and frequency on the magnetization vector. Alternatively, an imaging sequence may be designed for a three-dimensional imaging region. Time sequences suitable for PRF thermometry include, for example, gradient-recalled echo (GRE) and spin echo sequences.

The time-varying RF response signal, which is integrated over the entire (two- or three-dimensional) imaging region, is sampled to produce a time series of response signals that constitute the raw image data. Each data point in this time series can be interpreted as the value of the Fourier transform of the position-dependent local magnetization at a particular point in k space, where k is a function of the time development of the gradient fields. Thus, by acquiring a time series of the response signal and Fourier-transforming it, a real-space image of the tissue (i.e., an image showing the measured magnetization-affecting tissue properties as a function of spatial coordinates) can be reconstructed from the raw data. Computational methods for constructing real-space image data from the raw data (including, e.g., fast Fourier transform) are generally known to those of skill in the art, and can readily be implemented without undue experimentation in the image-processing system 150 in hardware, software, or a combination of both.

In the presence of therapy-induced temperature changes, a hot spot appears in the phase of the image data because the resonance frequency of water protons decreases with increasing temperature. Accordingly, for the purpose of PRF thermometry, the image processing system 150 further includes functionality for extracting phase information from the real-space image data, and computing a real-space map of the temperature-induced phase shift based on images acquired before as well as after (or during) heating of the target tissue (i.e., the baseline and treatment images). From the phase shift map, a map of temperature changes (in units of $\Delta°$ C.) may be computed via multiplication with a constant c that is given by:

$$c = \frac{1}{\gamma \alpha TEB_0},$$

where $\alpha$ is the applicable PRF change coefficient (which is $-0.01$ ppm/° C. for aqueous tissue), $\gamma$ is the proton gyromagnetic ratio, $B_0$ is the main magnetic field strength, and TE is the echo time of the GRE or other imaging sequence.

In general, the image phase can arise from several sources in addition to temperature changes in the ROI during thermal treatment. In particular, between acquisition of the baseline and treatment images of the imaging region 111, the ROI, which is typically a part of the patient's body, may change its shape and/or position due to movements of the patient's body. For example, if the ROI is a tumor inside the brain, its location changes if the patient turns her head slightly to the left or to the right during the procedure. If the ROI is part of the patient's abdominal area, its shape may contract or expand with the patient's respiratory cycle. As a result, the position and shape of the ROI may differ between the baseline and treatment images, and, in addition, the magnetic field may be perturbed as a result of the motion. The present invention provides various approaches to separating these and other contributions to phase shifts from those associated with the hot spot. These approaches, generally, involve fitting an image model that accounts for both temperature-induced and other components of the image phase and is at least partially based on one or more baseline images required prior to heating, and then fitting this model to the treatment image using a numerical model fitting algorithm. Image models and numerical techniques in accordance with various embodiments are described in detail below. In some embodiments, a phase-unwrapping algorithm may be applied prior to or in conjunction with model-fitting, i.e., phase values within a $2\pi$-range may be adjusted by addition or subtraction of multiples of $2\pi$ to yield a smooth phase image without discontinuities.

Figure 2:
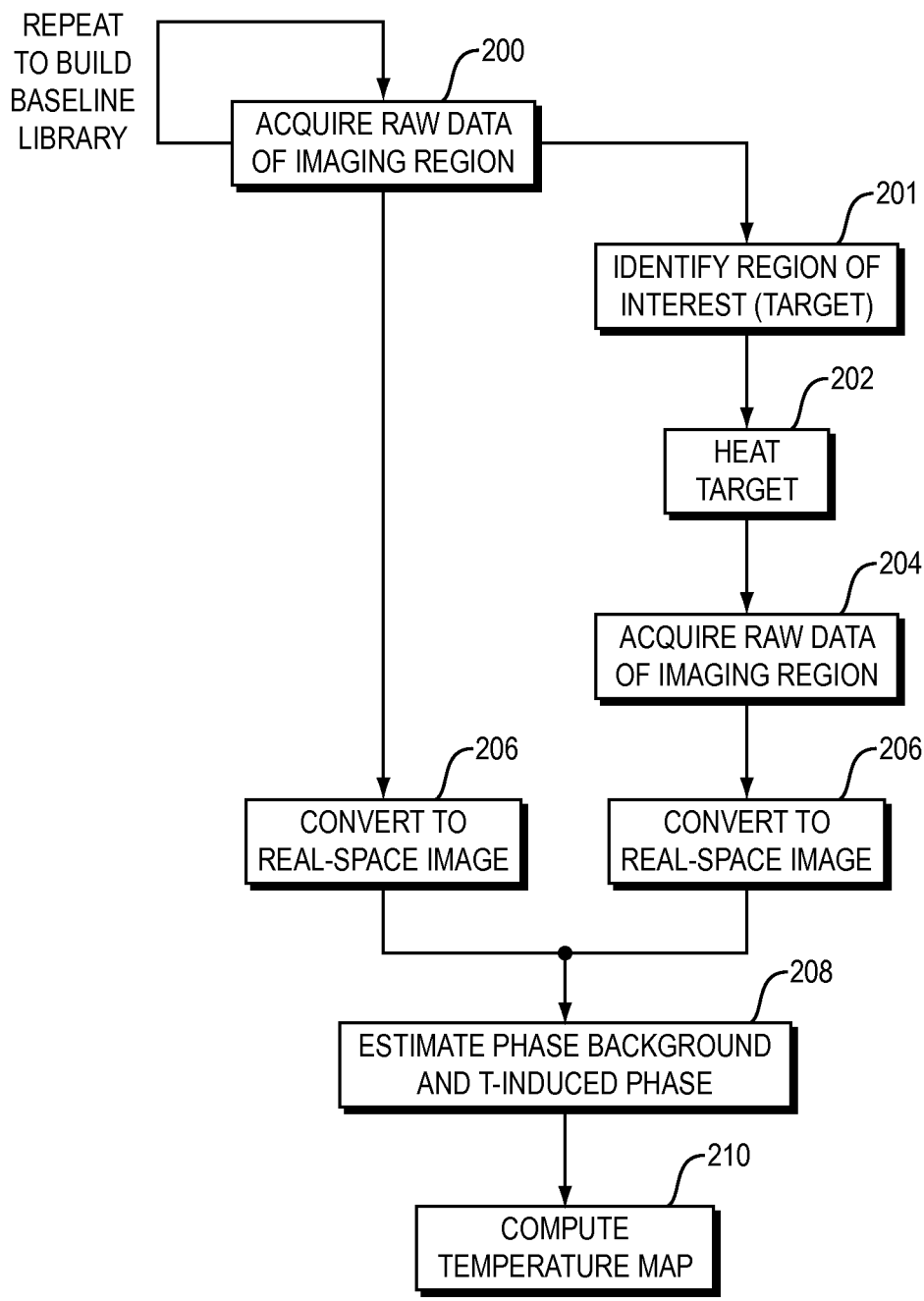
FIG. 2 is a flow chart conceptually illustrating PRF thermometry methods in accordance with various embodiments.

FIG. 2 summarizes data acquisition and processing methods in accordance with various embodiments in the form of a flow chart. In a first step 200, an MR imaging sequence is carried out to acquire a response signal from the imaging region, which is subsequently converted to raw image data (i.e., "k-space data"). This step may be repeated multiple times, e.g., at different stages during a periodic cycle of motion, such as a cardiac or respiratory cycle, resulting in a series of baseline images. Prior to thermal treatment, the target tissue (which corresponds to the ROI) may be selected in a (real-space) MR image of the imaging region (step 201). In some embodiments, this selection is manual, i.e., based on user input (e.g., a line drawn with a mouse to circumscribe the target in the image), whereas in other embodiments, it is accomplished automatically by a computer algorithm (e.g., a conventional algorithm that thresholds the pixel values, exploiting contrast in the MR image between the target and the surrounding tissues).

After thermal treatment of the target tissue (step 202), raw image data of the same general imaging region are again acquired (step 204). Typically, the baseline image(s) are acquired in the same patient as the treatment images, to achieve maximum comparability of the images. In certain embodiments, however, the baseline images are acquired in a different person or group of people (taking advantage of the general similarity between different people's cycles of motion), which reduces the total imaging time for the patient to be thermally treated. The baseline image(s) and treatment image may be converted to real-space images (step 206), and processed to estimate a phase background for subtraction from the treatment images to obtain an estimate of the temperature-induced phase (step 208). Finally, the temperature distribution in the imaging region is computed from the temperature-induced phase (step 210).

The image processing steps 206, 208, 210 are usually implemented in real-time during the treatment, for guidance of the therapeutic procedure. Real-time implementations typically utilize a model-fitting algorithm that may be executed with sufficient speed by the hardware employed; suitable facilities for transferring image data to a computer running the algorithm; and a real-time display of the temperature maps produced by the techniques described herein. In some applications, image processing may take place offline, after completion of the image acquisition process, for example, to confirm an administered dose after treatment, or in non-treatment temperature monitoring scenarios (such as checking that the patient has not been subjected to heating by the MRI scanning process itself).

2. Treatment Image Models

In various embodiments, methods of compensating for the background phase in a treatment image utilize a model of the treatment image that accounts for phase shifts resulting from both thermal therapy and other sources. Usually, the treatment image phase reflects anatomical features that are created by local field inhomogeneities and phase variations imposed by the transmit and receive coils. At a given point in the target organ's cycle of motion, these sources can generally be regarded as static over the course of thermal therapy and can, therefore, be captured with baseline images acquired prior to treatment. Other sources of phase variation are smooth mainfield shifts resulting from, e.g., respiration and bowel filling. These phase contributions can be taken into account by extrapolating the image phase surrounding the hot spot into the hot-spot subregion (i.e., the ROI).

In some embodiments, these sources are combined into the following model for image pixel or voxel j during treatment:

$$y_j = \left(\sum_{b=1}^{N_b} x_{b,j} w_b\right) e^{i(\{A\vec{c}\}_j + t_j)},$$

where $y_j$ denote the components of the treatment image, the $x_{b,j}$ are complex-valued image components from the baseline library ($N_b$ being the number of baseline images, which is at least one), the $w_b$ are weights associated with the baseline images, A is a an n-by-m matrix of smooth basis functions where n is the number of pixels in an image and m is the number of basis functions, $\vec{c}$ is a vector of coefficients associated with these basis functions, and t is a vector of temperature-induced phase shifts. Thus, the treatment image is modeled by two factors: a complex-valued combination of baseline images (which may degenerate to a single baseline image if all but one coefficient $w_b$ are zero), and a phase factor for extending the phase surrounding the hot spot subregion smoothly into that subregion.

The smooth basis functions (each of which corresponds to a column in matrix A) may, for example, be non-zero (typically low-order) polynomials, splines (i.e., smooth piecewise polynomial functions), or generally any functions suitable for fitting the phase around the hot spot and smoothly extrapolating it into the hot spot subregion. In some embodiments, the basis functions are selected prior to the numerical fitting procedure, while in alternative embodiments, the space of basis functions is expanded during fitting, based on a criterion indicative of the quality of the fit. For example, the numerical algorithm may start with second-order polynomials, and gradually add higher-order polynomials as needed until a satisfactory approximation of the image phase is achieved.

The image model may be varied in several ways. For example, instead of expressing the baseline factor as a linear combination (i.e., weighted average) of the baseline images, any function of the baseline images suited to a particular application may, generally, be used. Nonlinear combinations of baseline images may be particularly useful to approximate the treatment image if the subregion has changed in shape, whereas linear combinations may be preferable if the motion involves a mere translation within the range of motion captured by the baseline images. For example, if the image region moves during a respiratory cycle in a direction perpendicular to an image slice, the treatment image may be simply a weighted average of the two baseline images bracketing the treatment image's stage within that cycle.

Further, instead of using complex-valued baseline and treatment image data, the phase information may be extracted from the respective images, and the treatment phase may be directly approximated by a combination of baseline phase images. The weighted average of baseline functions may, in this case, be integrated into the phase component $A\vec{c}$. Conversely, as is known, referenceless thermometry methods can be applied to complex images of unit magnitude, but with the same phase as the original image, in order to avoid the influence of phase wraps. The same concept can be applied to the hybrid image model, by modifying the image model as:

$$y_j = \left(\sum_{b=1}^{N_b} x_{b,j} w_b\right) (\{A\vec{c}_R\}_j + i\{A\vec{c}_I\}_j) e^{it_j},$$

where separate coefficient vectors are estimated for the real and imaginary components $\vec{c}_R$ and $\vec{c}_I$ of the smooth phase shift. This extension may be more valuable in applications of the hybrid method than it is to masked $L_2$ referenceless thermometry applications because, in the interest of ease of use, the hybrid method may be applied to larger regions of space, over which there are more likely to be phase wraps.

In some embodiments, the baseline phase is computed separately different k-segments in the raw data. In the hybrid image model, the baseline component then includes sums over both the number of baseline images $N_b$ and the number of separately fitted k-space segments $N_{seg}$.

$$y_j = \left( \sum_{s=1}^{N_{seg}} \sum_{b=1}^{N_b} x_{b,j}^s w_b^s \right) e^{i((A\vec{c})_j + t_j)}.$$

Figure 3:
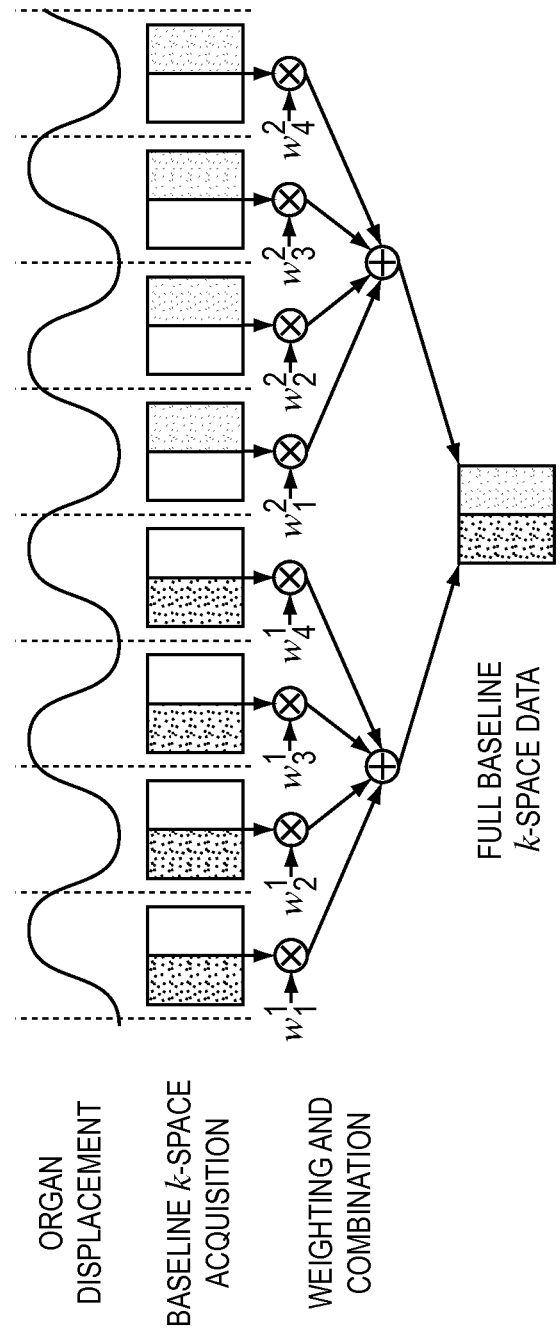
FIG. 3 illustrates segmented k-space baseline weighting in accordance with various embodiments.

FIG. 3 illustrates segmented k-space baseline weighting at the example of data acquisition that is too slow to resolve the organ's movement (shown by the periodic curve). The baseline k-space data is segmented and acquired repeatedly to capture each segment of k-space (illustrated as the shaded boxes) at several motion passes. A full set of k-space data can then be synthesized from the segmented acquisitions, e.g., by linearly combining the baselines acquisitions for each segment. Since the various k-space segments are generally acquired sequentially, assigning separate baseline weights to them allows to compensate for intra-image motion (i.e., motion that takes place during the acquisition of an individual image, as opposed to between acquisitions of images).

3. Numerical Processing

Separating the treatment phase into an estimated phase background and a temperature-induced phase generally involves determining the baseline weights $\vec{w}=[w_1 \ldots w_{N_b}]^T$, the smooth phase extension vector c, and the temperature-induced phase t by numerically fitting the image model to the treatment image (in k-space or in real space) using an iterative or non-iterative technique. In some embodiments, $\vec{w}$, $\vec{c}$, and $\vec{t}$ are determined sequentially, and in some embodiments, they are estimated in parallel, e.g., in an iterative procedure that cycles through w, c, and t. In the following, various exemplary algorithms are described in detail. These algorithms can be readily implemented in software and executed on a general-purpose computer. Suitable programming languages include, for example, C, C++, Fortran, Basic, and Python.

3.1 Baseline Fit and Polynomial Regression

Figure 4:
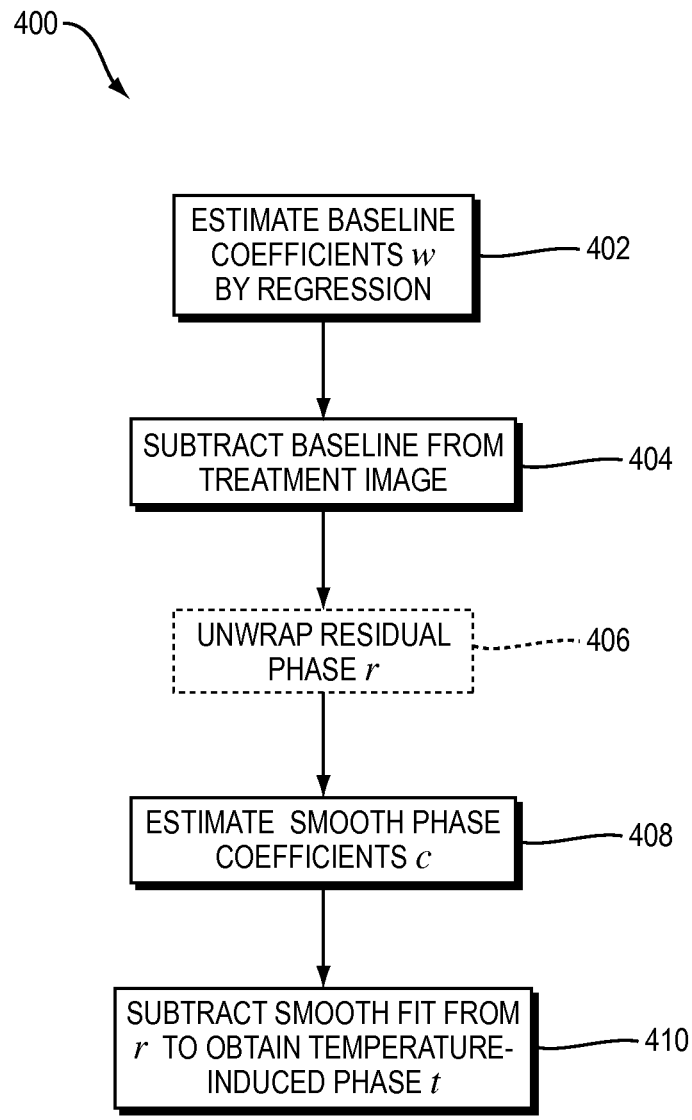
FIG. 4 is a flow chart illustrating a method for sequentially fitting the multibaseline and smooth phase shift components of a hybrid image model in accordance with various embodiments.

FIG. 4 illustrates a method 400 in which the anatomical phase (as captured by the baseline images) is first fitted to and subtracted from the treatment image to yield a residual phase, and the smooth phase shifts (as captured by $A\vec{c}$) are then subtracted from the residual phase to yield the temperature-induced phase. In a first step 402, the coefficients associated with the baseline images are estimated using any of a number of regression methods known to those of skill in the art. For example, if the model includes a linear combination of baseline images, the weights $w_b$ may be computed by a least-square regression, $$\frac{1}{2} \| |\vec{y}| - \sum_{b=1}^{N_b} |\vec{x}_b| w_b \|^2,$$

where the weights $w_b$ are constrained to be non-negative and to sum up to 1:

$$\sum_{b=1}^{N_b} w_b = 1$$

$$w_b \geq 0 \ \forall b.$$

This minimization procedure may result in the selection of a single baseline image (e.g., if that image is more similar to the treatment image than any other baseline image), or a combination of two or more baseline images.

Determining the baseline weights by a fitting procedure obviates the need for independent navigator information that associates the treatment image with a particular stage in the cycle of motion, or information about the proximity of the target location in the treatment image to the target location in the baseline images. However, to the extent such information is available, it may supplement the determination of baseline weights based on image similarity to the treatment image, as measured by the least-square regression. For example, such additional information may be used to truncate the baseline library, i.e., to identify a subset of baseline images for the subsequent regression. In some embodiments, the baseline library is extend by baseline images derived from measured baseline images, e.g., by computationally shifting the images. A library of baseline images corresponding to different spatial positions may, thus, be generated from a single image acquired prior to treatment.

Once the baseline coefficients have been determined, the baseline phase background is subtracted from the treatment image phase (step 404), resulting in a residual phase $\vec{r}$. If the baseline and treatment images are complex-valued, phase subtraction corresponds to pixel-wise multiplication of the complex images:

$$r_j = \angle \left( \left( \sum_{b=1}^{N_b} x_{b,j}^* \hat{w}_b \right) y_j \right),$$

where * denotes complex conjugation, $\angle$ denotes extraction of the phase from the complex quantity, and $\hat{w}_b$ are the weights determined in the previous step. The residual phase may, optionally, be unwrapped (step 406). (Methods for phase unwrapping are well-known to those of skill in the art and are described, for example, in U.S. patent application Ser. No. 12/615,780, filed on Nov. 10, 2009, which is hereby incorporated herein by reference in its entirety.)

In the next step 408, the smooth phase coefficients $\vec{c}$ are estimated via regression. Because the residual phase $\vec{r}$ contains both smooth background phase and the hot spot (unless the hot spot has been artificially removed by setting pixel values within the hot spot subregion to zero or an average background phase), a robust regression algorithm is preferable (over, e.g., a least-square regression, although the latter may, in principle, also be used):

$$\hat{\vec{c}} = \underset{c}{\mathrm{argmin}} \| \mathrm{diag}(|y_j|)(\vec{r} - A\vec{c}) \|_0.$$

Robust regression allows treating the phases of spatial points within the hot spot as outliers, thereby preventing their influence on the estimate $\hat{\vec{c}}$. A technique commonly used in statistical analysis to avoid the influence of outliers in data is $L_1$ regression. technique commonly used in statistical analysis to avoid the influence of outliers in data. Mathematically, the $L_1$ regression problem for estimating the smooth phase coefficients c may be stated as:

$$\hat{\vec{c}} = \underset{c}{\mathrm{argmin}} \| \mathrm{diag}(|y_j|)(\vec{r} - A\vec{c}) \|_1 = \underset{c}{\mathrm{argmin}} \sum_{j=1}^{N_s} \| y_j | (r_j - \{A\vec{c}\}_j) |, \quad (1)$$

where $N_s$ is the number of pixels (or voxels) in the image. This problem can be straightforwardly solved using linear programming, iteratively-reweighted least-squares, or iterative soft thresholding. While solving the above equation (1) yields smooth phase estimates that are more robust to the presence of the hot spot than least-squares regression, the influence of the hot spot may be further reduced using iterative reweighted $L_1$ regression to approximately solve an $L_0$ regression problem.

Reweighted $L_1$ regression may be implemented by the following algorithm:

1. Set l=0 and $W^0 = \mathrm{diag}(|y_j|)$.
2. Solve the weighted $L_1$ minimization problem $$\hat{\vec{c}}^l = \underset{c}{\mathrm{argmin}} \| W^l (\vec{r} - A\vec{c}) \|_1 .$$

3. Update the weights by setting $d = \vec{r} - A\hat{\vec{c}}^{l-1}$, and set $$W^{l+1} = \mathrm{diag}\left( \frac{|y_j|}{|d_n| + \beta\sigma} \right).$$

4. Terminate if $l = l_{max}$, the maximum number of reweights. Otherwise, go to step 2. In general, $\beta$ may be set to 0.001, and $\sigma$ may be defined as the standard deviation of $\vec{r}$ multiplied by the image magnitude.

Figure 5A:
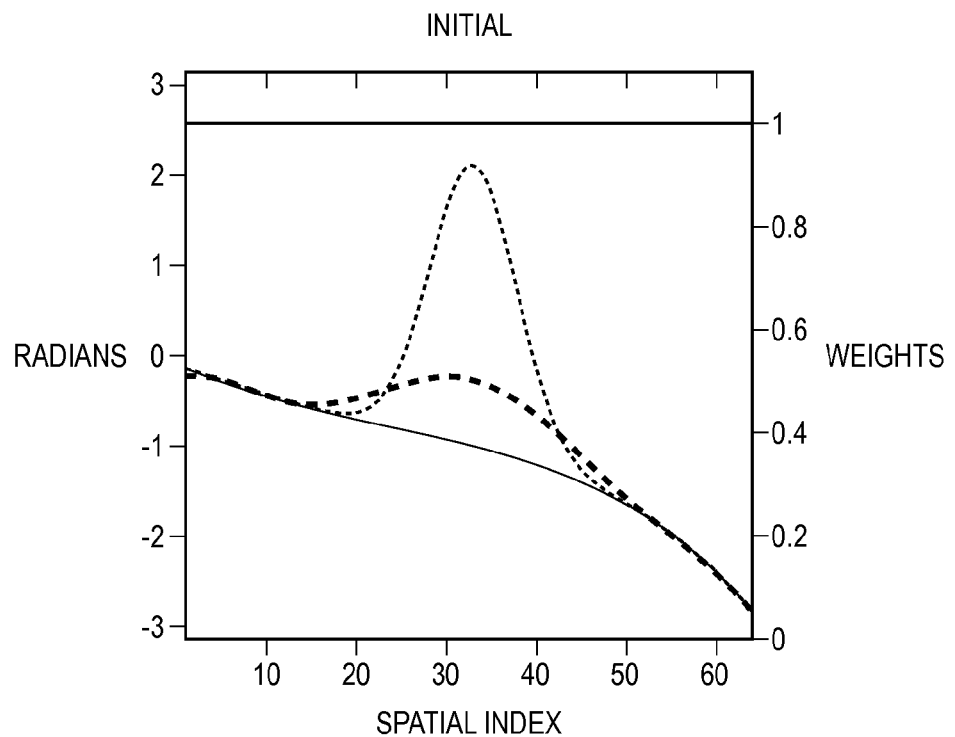
FIGS. 5A-5C are graphs.
Figure 5B:
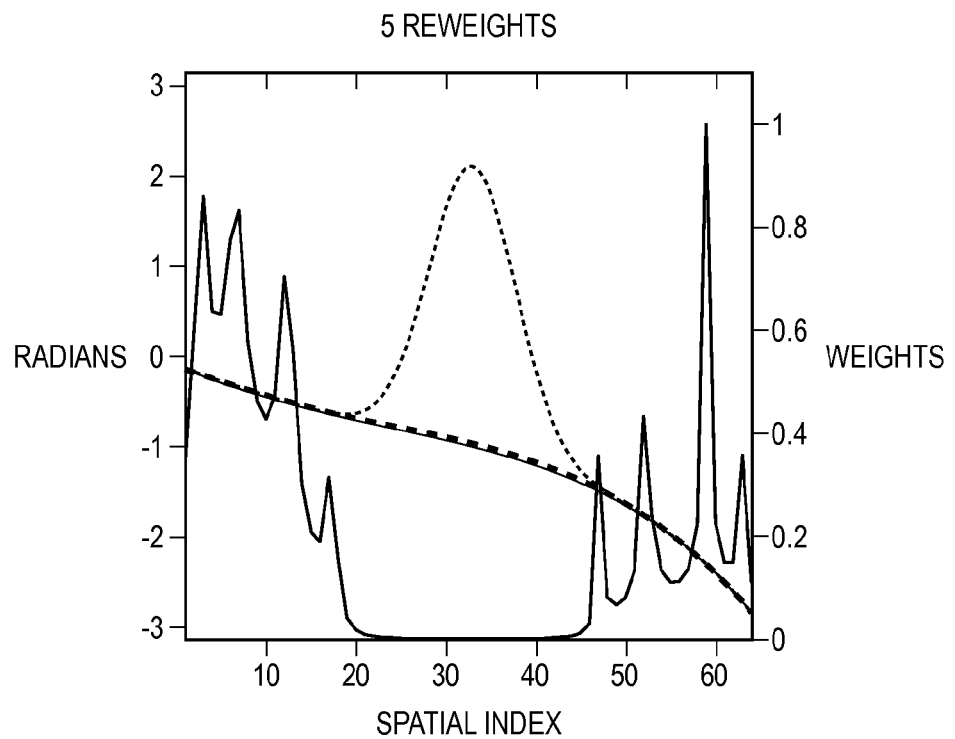
Figure 5C:
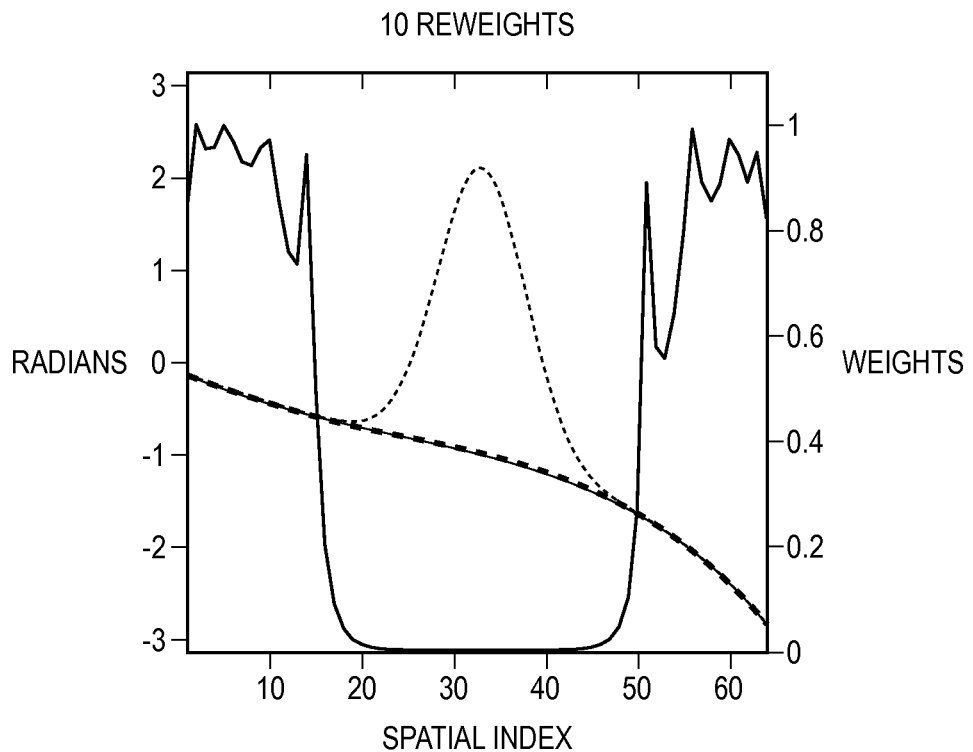
Figure 5D:
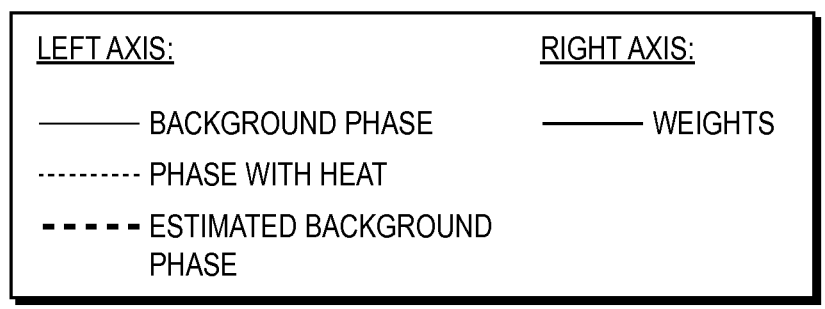
FIG. 5D is a corresponding legend, illustrating iterative reweighted $L_1$ regression of a hybrid image model in accordance with one embodiment.

FIGS. 5A-5D illustrate, in an exemplary application, how reweighting enhances hot spot rejection by down-weighting spatial locations where previous fits resulted in a large residual error. As shown in FIG. 5A, the initially estimated background phase is biased significantly towards the hot spot. However, because the residual is highest in the hot spot, that area is increasingly down-weighted in subsequent reweights, while the fit outside the hot spot becomes increasingly accurate. After 10 reweights, the hot spot is masked out entirely, and the background phase has been accurately estimated (FIG. 5C). It should be noted that, if the location of the hot spot is known a priori, then standard referenceless thermometry (i.e., masked $L_2$ thermometry) may be used to estimate the smooth phase shift coefficients $\vec{c}$.

In some embodiments, the smooth basis functions are not fitted directly to the residual phase, but to a spatial derivative thereof. In particular, a residual phase derivative image may be generated by computing finite differences between neighboring pixels in the residual phase image. The smooth basis functions may then be fitted to the image of finite differences, and may subsequently be spatially integrated to yield a smooth phase extension of the residual phase. Using this approach, the phase-unwrapping step 406 is not necessary.

With renewed reference to FIG. 4, after the coefficients $\vec{c}$ have been determined, the resulting smooth function fit is subtracted from the residual phase (step 410), to obtain an estimate of the treatment-induced phase shift:

$$\hat{\vec{t}} = \vec{r} - A\hat{\vec{c}}.$$

3.2 Iterative Regularized Estimation

An alternative approach to solving the hybrid thermometry problem is to minimize the following penalized likelihood cost function (or a variation thereof) with respect to the multi-baseline weights $\vec{w}$, the smooth phase shift coefficients $\vec{c}$, and the temperature-induced phase shift $\vec{t}$:

$$\Psi(\vec{w}, \vec{c}, \vec{t}) = \frac{1}{2} \sum_{j=1}^{N_s} \left| y_j - \left( \sum_{b=1}^{N_b} x_{b,j} w_b \right) e^{i(\{A\vec{c}\}_j + t_j)} \right|^2 + \lambda \| \vec{t} \|_0 + \beta R(\vec{t}), \quad (2)$$

where $\|\vec{t}\|_0$ equals the number of nonzero elements in $\vec{t}$, $R(\vec{t})$ is a quadratic regularizing roughness penalty function, and $\lambda$ and $\beta$ are regularization parameters that control the sparsity and roughness, respectively, of $\vec{t}$. As in method 400, the elements of w are required to be non-negative, and sum to 1.

The $L_0$ penalty on $\vec{t}$ (i.e., the term $\lambda \|\vec{t}\|_0$) serves to encourage sparse estimates, which is desirable because the hot spot is expected to be localized to a small region of the image. This penalty is also important to the separation of the phase change from the background phase; without it, the estimated $\vec{t}$ can, in some applications, contain the background image phase. Nonetheless, in certain circumstances, a cost function that does not contain the non-sparseness penalty may be used. A quadratic roughness penalty (as implemented by the term $\beta R(\vec{t})$) may be employed because the heated voxels may be expected to be largely contiguous with each other, and the phase change map will not contain sharp edges in most treatment scenarios. This penalty also improves the accuracy of estimates in regions of low image magnitude.

The cost function $\Psi(\vec{w}, \vec{c}, \vec{t})$ may be minimized using a block alternating minimization approach that cycles through $\vec{w}$, $\vec{c}$ and $\vec{t}$, i.e., an algorithm that iteratively minimizes $\Psi(\vec{w}, \vec{c}, \vec{t})$ with respect to one of the three parameters while holding the other two constant. This way, the parameter estimates feed back into each other, which typically results in more accurate phase background estimates than the method 400 illustrated in FIG. 4. However, because $\Psi(\vec{w}, \vec{c}, \vec{t})$ is a non-convex function of $\vec{c}$ and $\vec{t}$, its success generally depends on the quality of the initial estimates. In certain embodiments, therefore, the estimates $(\hat{\vec{w}}, \hat{\vec{c}}, \hat{\vec{t}})$ provided by method 300 are used as initializers for the penalized likelihood cost function.

Figure 6:
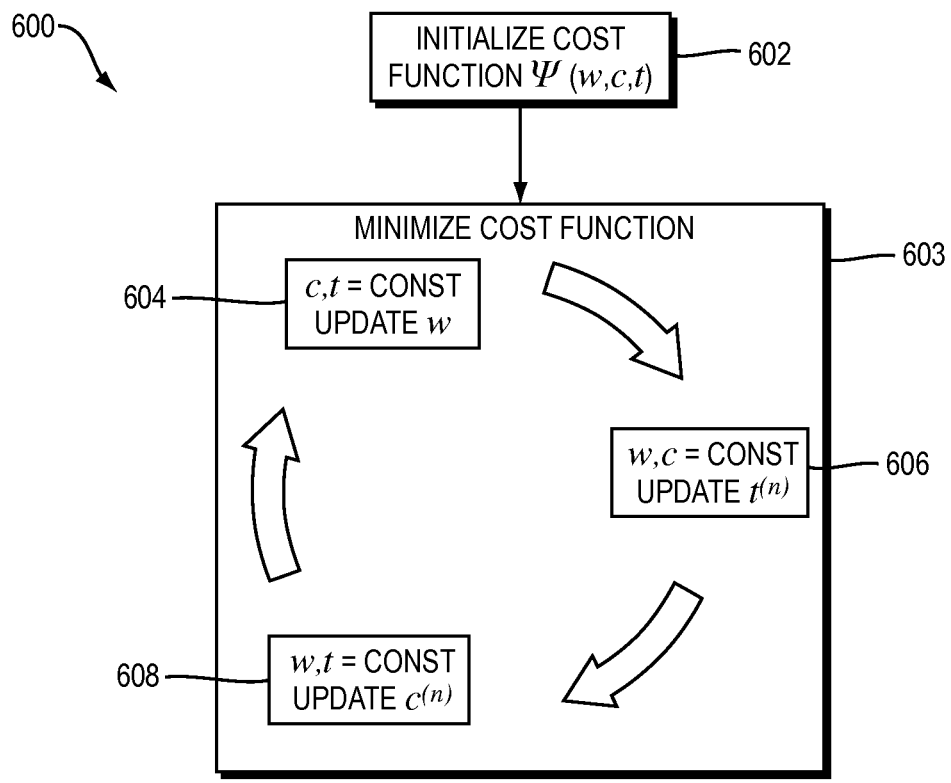
FIG. 6 is a flow chart illustrating an iterative regularized method for alternately fitting the multibaseline, smooth phase shift, and temperature-induced phase components of a hybrid image model in accordance with various embodiments.

FIG. 6 illustrates a method 600 for minimizing the cost function $\Psi(\vec{w}, \vec{c}, \vec{t})$. After a suitable initialization of $\vec{w}$, $\vec{c}$, and $\vec{t}$ (step 602), the cost function is minimized alternately with respect to each of the three types of parameters (step 603). For fixed c and $\vec{t}$, the baseline weights $\vec{w}$ may be obtained by minimizing:

$$\frac{1}{2} \sum_{j=1}^{N_s} \left| y_j e^{-i(\{A\vec{c}\}_j + t_j)} - \sum_{b=1}^{N_b} x_{b,j} w_b \right|^2$$

subject to:

$$\sum_{b=1}^{N_b} w_b = 1$$

$$w_b \geq 0 \quad \forall b.$$

(step 604). This quadratic program differs from the least-square regression in the method 400 shown in FIG. 4 (step 402) in that, here, the baseline images are not fitted to the original treatment image, but to an image derived from the treatment image by subtraction of the estimated hot-spot phase and smooth extension. Solvers for this type of convex optimization problem are well-known to those of skill in the art.

For fixed $\vec{w}$ and $\vec{c}$, the problem of minimizing $\Psi(\vec{w}, \vec{c}, \vec{t})$ with respect to (step 606) is nontrivial due to the nonlinearity of the complex exponential, and the $L_0$ penalty on $\vec{t}$. To implement the $L_0$ penalty, an iteratively-reweighted least-squares approach may be utilized; in particular, a vector of weights $v(\vec{t})$ may determined periodically as:

$$v_j(t_j) = (t_j^2 + \epsilon)^{-1},$$

where $\epsilon$ is a small parameter that is decreased slowly as iterations progress. The $L_0$ norm $\|\vec{t}\|_0$ may then be replaced by $$\frac{1}{2}\vec{t}^T \mathrm{diag}\{v_j\}\vec{t}, \quad (3)$$

which is quadratic and differentiable in $\vec{t}$.

To ensure that the first term in equation (2) is decreased monotonically, an optimization transfer approach in which a parabola is minimized as a surrogate for that term may be adopted, leading to the following iteration that will minimize $\Psi(\vec{w}, \vec{c}, \vec{t})$ with respect to t:

$$\vec{t}^{(n+1)} = \vec{t}^{(n)} - \mathrm{diag}\left\{\frac{1}{d_j^{(n)} + \lambda v_j + \beta e}\right\} \nabla \Psi(\vec{t}^{(n)}),$$

where $\nabla\Psi$ is the gradient of the cost function with respect to t following substitution of (3) for the $L_0$ norm, and e=16 for regularization using second-order differences. Defining $$\phi_j = \{A\vec{c}\} + t_j + \angle(\Sigma_{b=1}^{N_b} x_{b,j} w_b) - \angle y_j,$$

$d_j$ is given by:

$$d_j^{(n)} = \left| y_j \left(\sum_{b=1}^{N_b} x_{b,j} w_b\right) \right| \frac{\sin(\{\phi_j^{(n)}\} 2\pi)}{\{\phi_j^{(n)}\} 2\pi},$$

where $\{\phi_j^{(n)}\}_{2\pi} = |\phi_j^{(n)} - l2\pi|$ and l is an integer that satisfies $|\phi_j^{(n)} - l2\pi| \leq \pi$.

The coefficients $\vec{c}$ associated with the smooth extension may be estimated in a similar manner (step 608):

$$\vec{c}^{(n+1)} = \vec{c}^{(n)} - (H^{(n)})^{-1} A^T \nabla \Psi(\vec{c}^{(n)}),$$

where $$H^{(n)}H = A^T \mathrm{diag}\left\{\left| y_j \left(\sum_{b=1}^{N_b} x_{b,j} w_b\right)\right| \frac{\sin(\{\phi_j^{(n)}\} 2\pi)}{\{\phi_j^{(n)}\} 2\pi}\right\} A.$$

This iterative method 600 generally increases computational cost, compared with the non-iterative method 400, but typically results in an overall improved model fit because the jointly minimized parameters $\vec{w}$, $\vec{c}$, and $\vec{t}$ feed back into each other. Furthermore, this method 600 allows for flexible incorporation of prior information about the temperature phase shift map $\vec{t}$, such as information regarding its sparsity and smoothness.

3.3. Phase-Only Fit using Polynomial Regression with a Hybrid Phase Library

Figure 7:
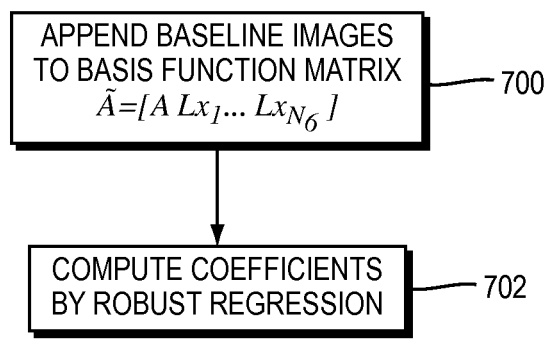
FIG. 7 is a flow chart illustrating a regression method for simultaneously fitting the multibaseline and smooth phase shift components of a hybrid image model in accordance with various embodiments.

For image models that include a linear combination of baseline images, the computation of the baseline weights may be integrated with the determination of the polynomial (or other smooth basis function) coefficients. In particular, as illustrated in FIG. 7, the baseline images may be appended to the basis function matrix A (step 700), yielding an expanded matrix Ã (whose number of columns is the sum of the number of basis functions and the number of baseline images):

$$\tilde{A} = [A \angle x_1 \ldots \angle x_{n_b}],$$

where $\angle x_b$ is the phase of baseline image b. A combined vector c of smooth basis function coefficients and baseline weights may then be determined via robust regression (step 702):

$$\hat{c} = \underset{c}{\mathrm{argmin}} \| \mathrm{diag}(|y_j|)(\angle \vec{y} - A\tilde{c}) \|_0.$$

Advantageously, this method of simultaneously solving for the baseline weights and basis function coefficients allows to automatically transition between hybrid and referenceless thermometry (the latter resulting from estimated baseline weights being zero). This feature is desirable if the target tissue in the patient leaves the range of motion covered by the baseline library. The ability to transition between hybrid and referenceless thermometry may also be achieved with maximum likelihood approaches that fit combined hybrid and referenceless treatment models.

4. Variations and Modifications

Several extensions and modifications to the above-described approach may be used, e.g., to improve its performance in different applications.

For example, the model and numerical methods can be easily extended to multicoil image reception. In some embodiments, this is accomplished by estimating separate (but not necessarily independently-estimated) baseline coefficients $\vec{w}$ and smooth phase-shift coefficients $\vec{c}$ for each coil, but a common heat phase shift $\vec{t}$. For example, using the iterative penalized-likelihood algorithm described above, the separate $\vec{w}$ and $\vec{c}$ vectors for each coil may feed back into each other (i.e., couple) through the common temperature-induced phase shift $\vec{t}$. Alternatively, the images acquired by multiple coils may be combined prior to the phase-background estimation, or the phase background may be estimated with a penalized likelihood algorithm applied jointly to images from some or all of the receiver coils.

Further, it is often assumed that the position of the imaged slice within the magnet coordinates is fixed. In practice, if navigator information is available to track patient/organ motion, and the prescribed imaging plane is moved to compensate for such motion, then the approach described herein allows a previously acquired multibaseline library to be re-used on the new slice plane, and main-field shifts between the slice locations will be robustly removed by the polynomial regression component.

Reductions in computation time may be obtained by, e.g., carrying over polynomial and/or baseline library coefficients between images, since the coefficients should not change significantly if motion is small. The use of temporal roughness penalties to penalize differences between the coefficients and temperature maps of adjacent images may also improve convergence and stability.

The reweighted-$L_l$ regression technique described herein may be used for thermometry in isolation, without baseline images, if the anatomical phase within a target region is known to be quite smooth. In this application, the present approach represents an improvement over conventional referenceless methods in that it does not require the location of the hot spot to be known prior to estimation. Furthermore, the regularized technique may be used in isolation for standard multibaseline thermometry without polynomial regressors, or for referenceless thermometry.

Advantages of the hybrid approach described above (over pure multibaseline subtraction as well as referenceless methods) include resistance to errors caused by main-field shifts and other sources of smooth phase errors between baseline and treatment images, as well as the ability to estimate temperature in the presence of rapidly varying anatomical phase. However, various advantageous features of these techniques may be retained in multibaseline PRF shift methods even if they are not combined with referencesless thermometry. For example, compared with conventional multibaseline thermometry, which generally relies on independent navigator information and/or sophisticated image registration, fitting a library of baseline images via regression may provide a simpler, more conveniently implemented approach. Further, allowing combinations of multiple (including more than two) baseline images, rather than always selecting the best-fitting image or interpolating between only two images, provides greater flexibility in background phase estimation, which may compensate for more complex (e.g., intra-image or non-translational) motion.

Various image background estimation techniques described herein may also be used in frequency deviation thermometry, in which a temperature map can be computed from corresponding images of frequency shifts measured, for example, with sequential GRE sequences of varying echo times TE. Further, the techniques may be applicable to non-thermometry methods such as, for example, MR acoustic radiation force imaging, in which small tissue displacements induced by focused ultrasound are visualized so as to track the focus location without the need for tissue heating and thermometry.

While the foregoing description includes many details and specificities, it is to be understood that these have been included for purposes of explanation only, and are not to be interpreted as limitations of the present invention. It will be apparent to those skilled in the art that other modifications to the embodiments described above can be made without departing from the spirit and scope of the invention. Accordingly, such modifications are considered within the scope of the invention as intended to be encompassed by the following claims and their legal equivalents.

What is claimed is:

1. A multibaseline method of performing proton resonance frequency (PRF) thermometry, the method comprising the steps of:
   acquiring a plurality of PRF baseline images of an imaging region, each baseline image corresponding to a PRF phase background during the imaging region's cycle of motion;
   acquiring a PRF treatment image of the imaging region subsequent to temperature change of a subregion within the imaging region;
   estimating a phase background of the imaging region by fitting a combination of the PRF baseline images to the treatment image; and
   estimating a temperature distribution within the subregion based on the treatment image and the estimated phase background.

2. The method of claim 1, wherein the combination of the baseline images comprises a weighted average of the baseline image.

3. The method of claim 2, wherein fitting the combination of the baseline images comprises determining weights associated with the weighted average.

4. The method of claim 1, wherein the combination of the baseline images comprises a nonlinear combination of the baseline images.

5. The method of claim 1, further comprising spatially shifting at least one of the baseline images, and adding a resulting shifted baseline images to the plurality of baseline images.

6. The method of claim 1, wherein the phase background is estimated by fitting a combination of a subset of the baseline images to the treatment image, the baseline images of the subset being selected based on navigator information.

7. The method of claim 1, wherein the treatment image and the baseline images comprise real-space image data.

8. The method of claim 1, wherein the treatment image and the baseline images comprise k-space raw data.

9. The method of claim 8, wherein the treatment image comprises a plurality of k-space segments and the and baseline images each comprise a plurality of corresponding k-space segments, and wherein the combination of baseline images is fitted to the treatment image for each k-space segment independently.

10. The method of claim 1, wherein the phase background is modified, prior to estimating the temperature distribution, by a smooth extension of the phase surrounding the subregion into the subregion.

11. The method of claim 1, wherein the baseline and treatment images are two-dimensional.

12. The method of claim 1, wherein the baseline and treatment images are three-dimensional.

13. The method of claim 1, wherein the baseline and treatment images are acquired with multiple MRI receiver coils.

14. The method of claim 13, wherein the baseline images and the treatment images are each combined across the MRI receiver coils prior to the phase background estimation.

15. The method of claim 13, wherein the phase background is estimated independently for each MRI receiver coil, and the temperature distribution is synthesized based on weighted combinations, across receiver coils, of the treatment images and estimated phase backgrounds.

16. The method of claim 13, wherein the phase background is estimated for each MRI receiver coil while parameters associated with the estimations are shared across the receiver coils.

17. The method of claim 13, wherein the temperature distribution is estimated using a penalized-likelihood algorithm applied jointly to the baseline and treatment images acquired with the multiple MRI receiver coils.

18. A system for performing multibaseline proton resonance frequency (PRF) shift thermometry, the system comprising:
- (a) a magnetic resonance imaging (MRI) unit;
- (b) a control module in communication with the MRI unit and configured to cause the MRI unit to:
    - acquire a plurality of PRF baseline images of an imaging region, each baseline image corresponding to a PRF phase background during the imaging region's cycle of motion;
    - acquire a PRF treatment image of the imaging region subsequent to temperature change of a subregion within the imaging region;
    - estimate a phase background of the imaging region by fitting a combination of the PRF baseline images to the treatment image; and
    - estimate a temperature distribution within the subregion based on the treatment image and the estimated phase background; and
- (c) a display for displaying the temperature distribution.

* * * * *